US008467255B2

(12) United States Patent
Kim et al.

(10) Patent No.: US 8,467,255 B2

(45) Date of Patent: Jun. 18, 2013

(54) DATA RECEIVER HAVING AN INTEGRATION UNIT AND A SENSE AMPLIFICATION UNIT, AND SEMICONDUCTOR MEMORY DEVICE INCLUDING THE SAME

(75) Inventors: Dae-Hyun Kim, Hwaseong-si (KR); Seung-Jun Bae, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 71 days.

(21) Appl. No.: 13/162,948

(22) Filed: Jun. 17, 2011

(65) Prior Publication Data

US 2012/0063242 A1 Mar. 15, 2012

(30) Foreign Application Priority Data

Sep. 13, 2010 (KR) ........................ 10-2010-0089241

(51) Int. Cl.
*G11C 7/22* (2006.01)

(52) U.S. Cl.
USPC ............ 365/189.16; 365/189.05; 365/189.07; 365/203

(58) Field of Classification Search
USPC ............. 365/189.16, 189.05, 189.07, 189.09, 365/203
See application file for complete search history.

(56) References Cited

U.S. PATENT DOCUMENTS

| | | | | |
|---|---|---|---|---|
| 6,275,429 | B1 * | 8/2001 | Bae et al. | 365/203 |
| 2007/0171967 | A1 | 7/2007 | Bae et al. | |
| 2012/0063242 | A1 * | 3/2012 | Kim et al. | 365/189.05 |

FOREIGN PATENT DOCUMENTS

| | | |
|---|---|---|
| KR | 100801055 | 1/2008 |

OTHER PUBLICATIONS

Bae et al., A 40nM 7Gb/s/pin Single-ended Transceiver with Jitter and ISI Reduction Techniques for High-Speed DRAM Interface, 2010 Symposium on VLSI Circuits/ Technical Digest of Technical Papers, pp. 193-194, Samsung Electronics, Hwasung, Korea.

* cited by examiner

*Primary Examiner* — Andrew Q Tran

(74) *Attorney, Agent, or Firm* — F. Chau & Associates, LLC

(57) ABSTRACT

A data receiver in a memory device includes an integration unit, a sense amplification unit and a latch unit. The integration unit integrates a data signal to generate a first equalization signal in response to a sampling feedback signal. The data signal includes a plurality of data that are sequentially received. The sense amplification unit senses the first equalization signal to generate a second equalization signal in response to a sensing feedback signal. The latch unit latches the second equalization signal to generate a sampling data signal

20 Claims, 8 Drawing Sheets

1000a
1ST IDFE
2ND IDFE
3RD IDFE
4TH IDFE
1ST SA DFE
2ND SA DFE
3RD SA DFE
4TH SA DFE
1ST LATCH
2ND LATCH
3RD LATCH
4TH LATCH
DIN
CLK180
CLK270
CLK0
CLK90
VREF
INT0
INT90
INT180
INT270
SAD0
SAD90
SAD180
SAD270
SPD0
SPD90
SPD180
SPD270
1100a
1200a
1300a
1110
1120
1130
1140
1210
1220
1230
1240
1310
1320
1330
1340

1110a
INT0b
INT0
C12
C11
1115
SPD180b
MN16
MN17
VB
MN15
SPD180
AND11
CLK180
CLK270
DCLK1
DIN
VDD
MP12
N12
MN12
MN14
VB
1113
R11
1111
VDD
MP11
N11
MN11
MN13
VREF
VB

1150
INT0b
INT0
C42
C41
1157
SPD90b
MN49
MN48
MN50
VB
SPD90
1155
SPD180b
MN46
MN45
MN47
VB
SPD180
AND41
CLK180
CLK270
DCLK1
VDD
MP42
VDD
MP41
1151
N41
N42
DIN
MN42
MN44
R41
VB
MN41
MN43
VREF
VB
1153

2000
DQ
2010
2110
DIN
2100
DATA INPUT BUFFER
DATA RECEIVER
DATA OUTPUT BUFFER
2300
SPD
2200
2210
MEMORY CELL ARRAY
SENSE AMPLIFIER
COLUMN DECODER
2230
MEMORY CORE
ROW DECODER
2240
2220
RA
CA
2400
ADDRESS BUFFER
ADDR
2020

DATA RECEIVER HAVING AN INTEGRATION UNIT AND A SENSE AMPLIFICATION UNIT, AND SEMICONDUCTOR MEMORY DEVICE INCLUDING THE SAME

CROSS-REFERENCE TO RELATED APPLICATION

This application claims under 35 USC §119 priority to and the benefit of Korean Patent Application No. 2010-0089241, filed on Sep. 13, 2010 in the Korean Intellectual Property Office (KIPO), the entire content of which is incorporated by reference herein.

BACKGROUND

1. Technical Field

The present disclosure relates to a receiver, and, more particularly, to a high speed data receiver and a semiconductor memory device including the data receiver.

2. Discussion of the Related Art

When data is transmitted at a high speed through a transmission medium, whether wireless or through a transmission line, intersymbol interference (ISI) may occur based upon the characteristics of the transmission medium. Such ISI may distort an amplitude and a phase of a received signal, and bit errors may occur in a signal at a receiver. As the transmission speed becomes faster, the amplitude and the phase of the received signal at the receiver may be significantly distorted.

SUMMARY

In accordance with an exemplary embodiment a data receiver, configured to effectively reduce the ISI of a data signal to generate a sampling data signal, is provided.

An exemplary embodiment provides a semiconductor memory device including the data receiver.

According to an exemplary embodiment, a data receiver in a memory device includes an integration unit, a sense amplification unit and a latch unit. The integration unit integrates a data signal to generate a first equalization signal in response to a sampling feedback signal. The data signal includes a plurality of data that are sequentially received. The sense amplification unit senses the first equalization signal to generate a second equalization signal in response to a sensing feedback signal. The latch unit latches the second equalization signal to generate a sampling data signal.

The sensing feedback signal may be the second equalization signal corresponding to a first previous data received prior to a currently received data by one data period. The sampling feedback signal may be the sampling data signal corresponding to a second previous data received prior to the currently received data by two data periods.

In an exemplary embodiment, the integration unit may further receive a second sampling feedback signal and may generate the first equalization signal further in response to the second sampling feedback signal. The second sampling feedback signal may be the sampling data signal corresponding to a third previous data received prior to the currently received data by three data periods.

The data signal may include first through N-th data, where N is a natural number equal to or greater than two. The first through N-th data may have the same data period. The sampling data signal may include first through N-th sampling data. Each of the sampling data may correspond to a respective one of the first through N-th data.

The sampling feedback signal may include first through N-th sampling feedback signals. The first equalization signal may include first through N-th integration signals. The integration unit may include first through N-th integrating decision feedback equalizers (IDFEs). Each of the IDFEs may integrate a respective one of the first through N-th data to generate a respective one of the first through N-th integration signals in response to a reference voltage, a clock signal and at least one of the first through N-th sampling feedback signals.

The first sampling feedback signal may be a (N-1)-th sampling data. A second sampling feedback signal may be the N-th sampling data. A k-th sampling feedback signal may be a (k-2)-th sampling data, where k is a natural number equal to or greater than three and equal to or less than N.

Each of the IDFEs may include a precharge unit, an integration signal generation unit and a feedback unit. The precharge unit may precharge an output terminal to a power supply voltage. The output terminal may output the respective one of the first through N-th integration signals. The integration signal generation unit may integrate the respective one of the first through N-th data to generate the respective one of the first through N-th integration signals in response to the reference voltage and may provide the respective one of the first through N-th integration signals to the output terminal. The feedback unit may be connected to the output terminal, and may reduce ISI components included in the respective one of the first through N-th data in response to a respective one of the first through N-th sampling feedback signals.

The integration signal generation unit may include a first n-type metal oxide semiconductor (NMOS) transistor, a second NMOS transistor, a resistor, a third NMOS transistor and a fourth NMOS transistor. The first NMOS transistor may have a first electrode connected to a first node, a gate electrode receiving the reference voltage, and a second electrode. The first node may output the respective one of the first through N-th integration signals. The second NMOS transistor may have a first electrode connected to a second node, a gate electrode receiving the data signal, and a second electrode. The second node may output an inversion signal of the respective one of the first through N-th integration signals. The resistor may be connected between the second electrode of the first NMOS transistor and the second electrode of the second NMOS transistor. The third NMOS transistor may be connected between the second electrode of the first NMOS transistor and a ground voltage, and may have a gate electrode receiving a bias voltage. The fourth NMOS transistor may be connected between the second electrode of the second NMOS transistor and the ground voltage, and may have a gate electrode receiving the bias voltage.

The feedback unit may include a fifth NMOS transistor, a sixth NMOS transistor and a seventh NMOS transistor. The fifth NMOS transistor may have a first electrode connected to the first node, a gate electrode receiving the respective one of the first through N-th sampling feedback signals, and a second electrode. The sixth NMOS transistor may have a first electrode connected to the second node, a gate electrode receiving an inversion signal of the respective one of the first through N-th sampling feedback signals, and a second electrode connected to the second electrode of the fifth NMOS transistor. The seventh NMOS transistor may be connected between the second electrode of the fifth NMOS transistor and the ground voltage, and may have a gate electrode receiving the bias voltage.

The first through N-th data are sequentially input to the integration unit during one period of the clock signal.

The sensing feedback signal may include first through N-th sensing feedback signals. The clock signal may include first through N-th clock signals. The second equalization signal may include first through N-th sensing signals. The sense amplification unit may include first through N-th sense-amplifier-based decision feedback equalizers (SADFEs). Each of the SADFEs may sense the respective one of the first through N-th integration signals to generate a respective one of the first through N-th sensing signals in response to a respective one of the first through N-th clock signals and a respective one of the first through N-th sensing feedback signals.

The first sensing feedback signal may be the N-th sensing signal. A k-th sensing feedback signal may be a (k-1)-th sensing signal, where k is a natural number equal to or greater than two and equal to or less than N.

The each of the SADFEs may include a precharge unit, an integration signal comparison unit, a feedback signal comparison unit and a sensing signal generation unit. The precharge unit may precharge an output terminal to a power supply voltage. The output terminal may output the respective one of the first through N-th sensing signals. The integration signal comparison unit may compare the respective one of the first through N-th integration signals with an inversion signal of the respective one of the first through N-th integration signals. The feedback signal comparison unit may compare the respective one of the first through N-th sensing feedback signals with an inversion signal of the, respective one of the first through N-th sensing feedback signals. The sensing signal generation unit may be connected to the output terminal, may reduce IR components included in the respective one of the first through N-th data, and may generate the respective one of the first through N-th sensing signals based upon comparison operations of the integration signal comparison unit and the feedback signal comparison unit.

The sensing signal generation unit may include a first inverter and a second inverter. The first inverter may be connected between the power supply voltage and a first node. The second inverter may be connected between the power supply voltage and a second node. An output terminal of the second inverter may be connected to an input terminal of the first inverter, and may output the respective one of the first through N-th sensing signals. An output terminal of the first inverter may be connected to an input terminal of the second inverter and may output an inversion signal of the respective one of the first through N-th sensing signals.

According to an exemplary embodiment, a semiconductor memory device includes a data input buffer and a memory cell array. The data input buffer includes a data receiver that reduces ISI components included in a data signal to generate a sampling data signal. The memory cell array stores the sampling data signal and outputs the stored data. The data receiver includes an integration unit, a sense amplification unit and a latch unit. The integration unit integrates the data signal in response to a sampling feedback signal to generate a first equalization signal. The data signal includes a plurality of data that are sequentially received. The sense amplification unit senses the first equalization signal in response to a sensing feedback signal to generate a second equalization signal. The latch unit latches the second equalization signal to generate the sampling data signal.

Accordingly, in the data receiver according to an exemplary embodiment, the sense amplification unit may reduce the first ISI component caused by the first previous data, and the integration unit may reduce the second ISI component caused by the second previous data. Thus, the data receiver may have relatively high operation speed and may effectively generate the sampling data signal by compensating for distortion included in the data signal due to the ISI components.

In addition, in the data receiver according to an exemplary embodiment, the integration unit may include a plurality of the IDFEs, and the sense amplification unit may include a plurality of SADFEs. Thus, the data receiver may be implemented with a hybrid multi-tap structure having relatively small size and relatively low power consumption.

According to an exemplary embodiment a data receiver in a memory device includes an integration unit configured to sequentially receive consecutive data signals, a sense amplification unit configured to receive an output of the integration unit, and a latch unit configured to receive the output of the sense amplification and to output an equalized sampled data signal. The integration unit integrates a data signal to generate a first equalization signal in response to a sampling feedback signal that corresponds to a previous data signal that is received by the data receiver prior to a currently received data signal by two data periods. The sense amplification unit senses the first equalization signal to generate a second equalization signal in response to a second equalization signal that corresponds to a previous data signal that is received by the data receiver prior to a currently received data signal by one data period. The latch unit latches the second equalization signal to generate an equalized sampled data signal.

The integration unit may receive a second sampling feedback signal that includes a sampling data signal corresponding to a previous data signal that is received prior to a currently received data signal by three data periods.

The consecutive data signals may include first through N-th data signals, N being a natural number equal to or greater than two, the first through N-th data signals having a same data period.

The equalized sampled data signal may include first through N-th sampling data, each of the sampled data corresponding to a respective one of the first through N-th data signals.

First through N-th data signals may be sequentially input to the integration unit during one period of a clock signal, a clock period being N times larger than a data period, and a first data signal may be input to the integration unit during a first data period, a second data signal may be input to the integration unit during a second data period, and a N-th data signal may be input to the integration unit during a N-th data period.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1:
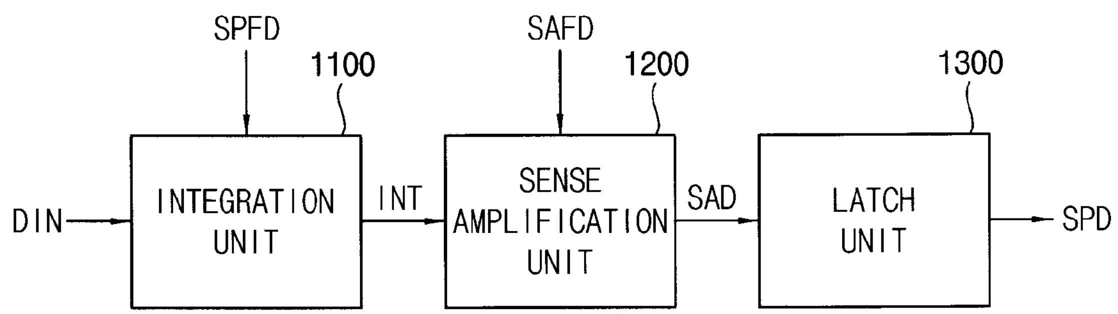
FIG. 1 is a block diagram illustrating a data receiver according to an exemplary embodiment.

FIG. 1 is a block diagram illustrating a data receiver according to an exemplary embodiment.

Referring to FIG. 1, the data receiver 1000 in a memory device includes an integration unit 1100, a sense amplification unit 1200 and a latch unit 1300. The data receiver 1000 equalizes and samples a data signal DIN to generate a sampling data signal SPD. The data signal DIN includes a plurality of data such as consecutive data symbols (e.g., waveforms representing integer bits) that are sequentially received. In this case, the data signal DIN may be a distorted signal due to ISI that is caused when one symbol interferes with subsequent symbols.

One of the causes of ISI is what is known as multipath propagation in which a wireless signal from a transmitter reaches the receiver via many different paths. The causes of this include reflection, such as when the signal bounces off building, refraction, such as when the signal passes through the foliage of a tree, and atmospheric effects. Since all of these paths are different lengths, and some of these causes can also slow the signal down, different versions of the signal can arrive at the receiver at different times. This delay means that part or all of a given symbol will be spread into the subsequent symbols, thereby interfering with the correct detection of those symbols. Additionally, the various paths often distort the amplitude and/or phase of the signal thereby causing further interference with the received signal. When the ISI is caused by previous data, the previous data that blurs with the current data acts much like noise being added to the current data.

To reduce the ISI, the integration unit 1100 and the sense amplification unit 1200 process the current data in response to feedback signals corresponding to the previous data. Decision feedback equalizers (DFEs) are utilized that make use of previous data decisions in an attempt to estimate a current data symbol.

The integration unit 1100 integrates the data signal DIN to generate a first equalization signal INT in response to a sampling feedback signal SPFD received from the latch unit 1300. The integration unit 1100 may further receive a clock signal and a reference voltage and may include a plurality of integrating decision feedback equalizers (IDFEs).

The sense amplification unit 1200 senses the first equalization signal INT to generate a second equalization signal SAD in response to a sensing feedback signal SAFD received from within the sense amplification unit 1200. The sense amplification unit 1200 may further receive the clock signal and may include a plurality of sense-amplifier-based decision feedback equalizers (SADFEs).

The latch unit 1300 latches the second equalization signal SAD to generate the sampling data signal SPD having reduced ISI. The latch unit 1300 may include a plurality of latch circuits.

The data signal DIN may include first through N-th data, where N is a natural number equal to or greater than two. The first through N-th data may have the same data period. The first through N-th data may be serialized and may be sequentially input to the integration unit 1100 as the data signal DIN. For example, the first data may be input to the integration unit 1100 during a first data period, a second data may be input to the integration unit 1100 during a second data period, and the N-th data may be input to the integration unit 1100 during a N-th data period. In an exemplary embodiment, the first through N-th data may be sequentially input to the integration unit during one period of the clock signal and each data set including the first through N-th data may be input to the integration unit 1100 for each period of the clock signal. In other words, the clock period may be N times larger than the data period.

The sensing feedback signal SAFD and sampling feedback signal SPFD may correspond to the previous data. For example, the sensing feedback signal SAFD may be the second equalization signal SAD corresponding to a first previous data that is received prior to a currently received data by one data period. The sampling feedback signal SPFD may be the sampling data signal SPD corresponding to a second previous data that is received prior to the currently received data by two data periods.

The sampling data signal SPD may include first through N-th sampling data. Each of the sampling data may correspond to a respective one of the first through N-th data. For example, the first sampling data may correspond to the first data, a second sampling data may correspond to the second data, and the N-th sampling data may correspond to N-th data.

As described above, the ISI may be caused when the previous data influences the current data. For example, a first ISI component may be caused by the first previous data and a second ISI component may be caused by the second previous data. The sense amplification unit 1200 may generate the second equalization signal SAD by reducing the first ISI component included in the data signal DIN in response to the sensing feedback signal SAFD. The second equalization signal SAD may correspond to the currently received data and the sensing feedback signal SAFD may correspond to the first previous data. The integration unit 1100 may generate the first equalization signal INT by reducing the second ISI component included in the data signal DIN in response to the sampling feedback signal SPFD. The first equalization signal INT may correspond to the currently received data and the sampling feedback signal SPFD may correspond to the second previous data.

In an exemplary embodiment, the integration unit 1100 may further receive a second sampling feedback signal. The second sampling feedback signal may be the sampling data signal SPD corresponding to a third previous data that is received prior to the currently received data by three data periods. The integration unit 1100 may generate the first equalization signal INT by reducing the second ISI component in response to the sampling feedback signal SPFD and by further reducing the third ISI component in response to the second sampling feedback signal.

In the present disclosure, the term "N-th ISI component" indicates the ISI that is caused by the previous data received prior to the currently received data by N data period.

In an exemplary embodiment, the number of the plurality of data received during one clock period may be substantially the same as the number of the plurality of IDFEs included in the integration unit 1100, the number of the plurality of SADFEs included in the sense amplification unit 1200 and the number of the plurality of latch circuits included in the latch unit 1300. For example, if the data signal DIN includes the first through N-th data, the integration unit 1100 may include first through Nth IDFEs, the sense amplification unit 1200 may include first through N-th SADFEs and the latch unit 1300 may include first through N-th latch circuits. In this case, the sampling feedback signal SPFD may include first through N-th sampling feedback signals, the first equalization signal INT may include first through N-th integration signals, the sensing feedback signal SAFD may include first through N-th sensing feedback signals, the second equalization signal SAD may include first through N-th sensing signals and the clock signal may include first through N-th clock signals.

A conventional data receiver included in a data transmission system includes an equalizer to compensate for distortion due to the ISI. The equalizer attempts to reduce ISI and allow recovery of a signal transmitted through the transmission medium. It typically involves simple filtering or can involve a complex algorithm. Examples include a simple linear equalizer which processes the incoming signal with a linear filter, a decision feedback equalizer (DFE) which augments the linear equalizer by adding a filtered version of previous symbol estimates to the original filter output, or an adaptive equalizer that is typically a linear equalizer or a DFE that can update filter coefficients as it is processes the data.

The conventional equalizer may be implemented with a multi-tap structure (e.g., multi-tap filter structure) for reducing not only the first ISI component but high-order ISI components e.g., the second and the third ISI components. However, in a multi-tap equalizer, a first period of time required to compensate for the distortion due to the first ISI component is relatively longer than the other periods of time required to compensate for the distortion due to the high-order ISI components. The conventional equalizer needs a relatively more complex structure to employ the multi-tap structure. Thus, the conventional data receiver including the conventional equalizer may have relatively large size and relatively large power consumption.

In the data receiver 1000 according to an exemplary embodiment, the sense amplification unit 1200 reduces the first ISI component in response to the sensing feedback signal SAFD corresponding to the first previous data, and the integration unit 1100 reduces the high-order ISI components e.g., the second ISI component, based upon the sampling feedback signal SPFD corresponding to the second previous data. In addition, the data receiver 1000 may be implemented with a hybrid multi-tap structure including both of the IDFE and the SADFE. For example, the integration unit 1100 may include a plurality of the IDFEs, and the sense amplification unit 1200 may include a plurality of SADFEs. Thus, the data receiver 1000 may have relatively small size and relatively low power consumption and may effectively reduce the ISI included in the data signal DIN to generate the sampling data signal SPD.

Figure 2:
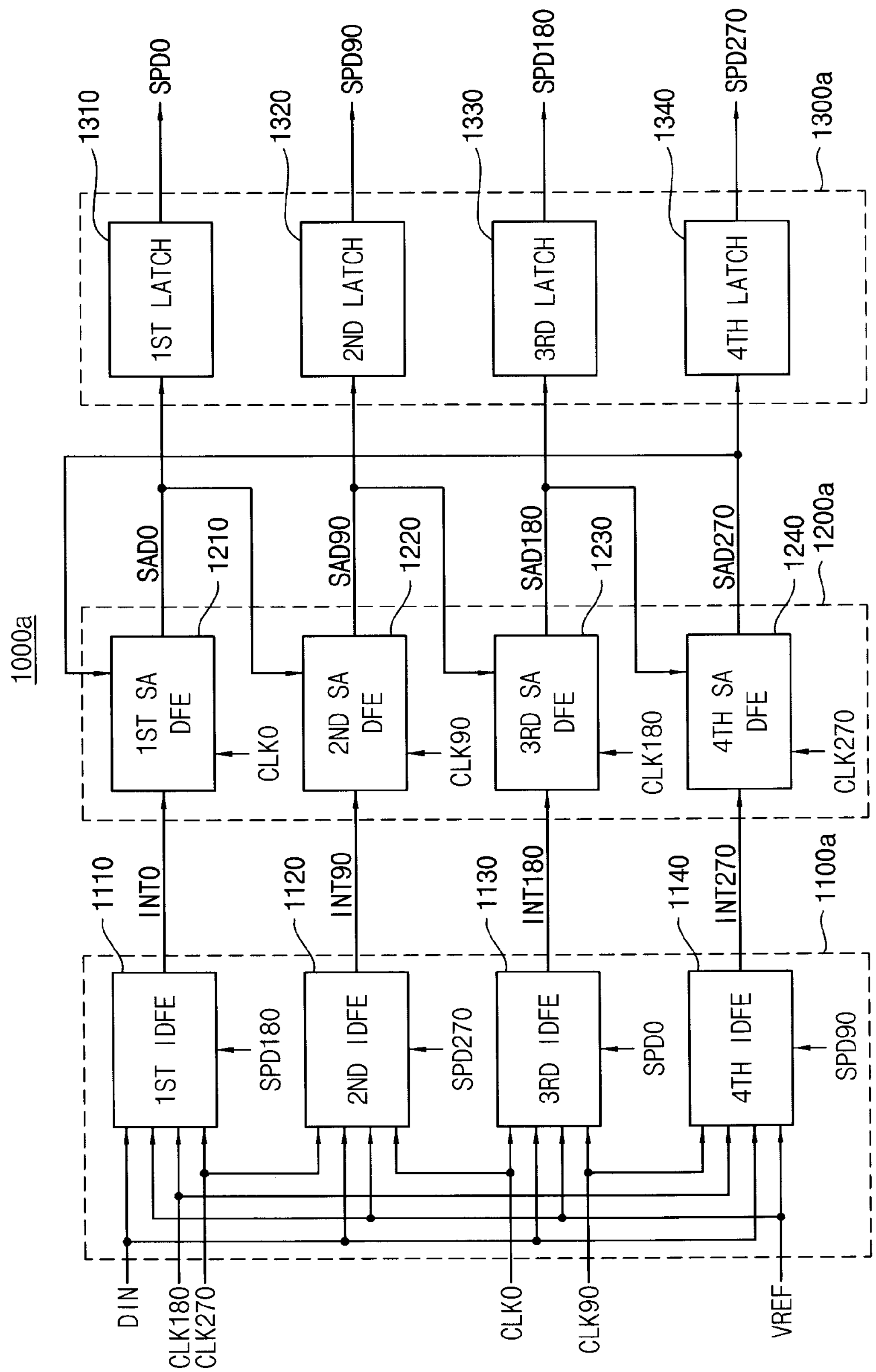
FIG. 2 is a block diagram illustrating an example of the data receiver of FIG. 1.

FIG. 2 is a block diagram illustrating an exemplary embodiment of the data receiver of FIG. 1.

Referring to FIG. 2, the data receiver 1000*a* includes an integration unit 1100*a*, a sense amplification unit 1200*a* and a latch unit 1300*a*.

As illustrated in FIG. 2, the data receiver 1000*a* may be implemented with four IDFEs, four SADFEs and four latch circuits (i.e., N=4). For example, the integration unit 1100*a* may include first, second, third and fourth IDFEs 1110, 1120, 1130, 1140. The sense amplification unit 1200*a* may include first, second, third and fourth SADFEs 1210, 1220, 1230, 1240. The latch unit 1300*a* may include first, second, third and fourth latch circuits 1310, 1320, 1330, 1340.

The data signal DIN may include first, second, third and fourth data DIN0, DIN90, DIN180, DIN270, each of the first, second, third and fourth data DIN0, DIN90, DIN180, DIN270 being input into the first, second, third and fourth IDFEs 1110, 1120, 1130, 1140, respectively. The data DIN0, DIN90, DIN180, DIN270 may have the same data period and may be sequentially input to the integration unit 1100*a* during one period of the clock signal. Each data set including the first through fourth data DIN0, DIN90, DIN180, DIN270 may be input to the integration unit for each period of the clock signal. For example, a first data set may be sequentially input to the integration unit 1100*a* during a first clock period and a second data set may be sequentially input to the integration unit 1100*a* during a second clock period.

The clock signal may include first, second, third and fourth clock signals CLK0, CLK90, CLK180, CLK270. The first through fourth clock signals CLK0, CLK90, CLK180, CLK270 may have a phase difference of predetermined degrees, respectively. The predetermined degrees may be calculated by dividing three hundred sixty degrees with N (e.g., four). For example, the second clock signal CLK90 may have a phase difference of ninety degrees with respect to the first clock signal CLK0. The third clock signal CLK180 may have the phase difference of ninety degrees with respect to the second clock signal CLK90. The fourth clock signal CLK270 may have the phase difference of ninety degrees with respect to the third clock signal CLK180. The data signal DIN and the clock signal will be described later with reference to FIG. 6.

The sampling feedback signal may include a first sampling feedback signal SPD180 received from 3$^{rd}$ latch 1330, a second sampling feedback signal SPD270 received from 4$^{th}$ latch 1340, a third sampling feedback signal SPD0 received from 1$^{st}$ latch 1210 and a fourth sampling feedback signal SPD90 received from second latch 1320. The first equalization signal may include a first integration signal INT0 from 1$^{st}$ IDFE 1110, a second integration signal INT90 from 2$^{nd}$ IDFE 1120, a third integration signal INT180 from 3$^{rd}$ IDFE 1130 and a fourth integration signal INT270 from 4$^{th}$ IDFE 1140. The sensing feedback signal may include a first sensing feedback signal SAD270 from 4$^{th}$ SADFE 1240, a second sensing feedback signal SAD0 from 1$^{st}$ SADFE 1210, a third sensing feedback signal SAD90 from 2$^{nd}$ SADFE 1220 and a fourth sensing feedback signal SAD180 from 3$^{rd}$ SADFE 1230. The second equalization signal may include a first sensing signal SAD0 from 1$^{st}$ SADFE 1210, a second sensing signal SAD90 from 2$^{nd}$ SADFE 1220, a third sensing signal SAD180 from 3$^{rd}$ SADFE 1230 and a fourth sensing signal SAD270 from 4$^{th}$ SADFE 1240. The sampling data signal may include a first sampling data SPD0 from 1$^{st}$ latch 1310, a second sampling data SPD90 from 2$^{nd}$ latch 1320, a third sampling data SPD180 from 3$^{rd}$ latch 1330 and a fourth sampling data SPD270 from 4$^{th}$ latch 1340.

Each of the first through fourth IDFEs 1110, 1120, 1130, 1140 may integrate a respective one of the first through fourth data DIN0, DIN90, DIN180, D1N270 to generate a respective one of the first through fourth integration signals INT0, INT90, INT180, INT270 in response to a reference voltage VREF, a respective two of the first through fourth clock signals CLK0, CLK90, CLK180, CLK270 and a respective one of the first through fourth sampling feedback signals SPD 180, SPD270, SPD0, SPD90. For example, the first IDFE 1110 may reduce the second ISI component included in the first data DIN0 and may integrate the first data DIN0 to generate the first integration signal INT0 in response to the reference voltage VREF, the third and fourth clock signals CLK180, CLK270 and the first sampling feedback signal SPD180.

Each of the first through fourth SADFEs 1210, 1220, 1230, 1240 may sense the respective one of the first through fourth integration signals INT0, INT90, INT180, INT270 to generate a respective one of the first through fourth sensing signals SAD0, SAD90, SAD180, SAD270 in response to a respective one of the first through fourth clock signals CLK0, CLK90, CLK180, CLK270 and a respective one of the first through fourth sensing feedback signals SAD270, SAD0, SAD90, SAD180. For example, the first SADFE 1210 may reduce the first ISI component included in the first data DIN0 and may sense the first integration signal INT0 to generate the first sensing signal SAD0 in response to the first clock signal CLK0 and the first sensing feedback signal SAD270.

Each of the first through fourth latch circuits 1310, 1320, 1330, 1340 may latch the respective one of the first through fourth sensing signals SAD0, SAD90, SAD180 and SAD270 to generate a respective one of the first through fourth sampling data SPD0, SPD90, SPD180, SPD270. For example, the first latch circuit 1310 may latch the first sensing signal SAD0 to generate the first sampling data SPD0.

The sensing feedback signal may be the second equalization signal corresponding to a first previous data that is received prior to a currently received data by one data period. For example, the first sensing feedback signal SAD270, which is input to the first SADFE 1210 for reducing the first ISI component included in the first data DIN0, may be the fourth sensing signal SAD270. The fourth sensing signal SAD270 may be generated based upon the fourth data D1N270 that is received prior to the first data DIN0 by one data period. Similarly, the second sensing feedback signal SAD0 for reducing the first ISI component included in the second data DIN90 may be the first sensing signal SAD0 corresponding to the first data DIN0. The third sensing feedback signal SAD90 for reducing the first ISI component included in the third data DIN180 may be the second sensing signal SAD90 corresponding to the second data DIN90. The fourth sensing feedback signal SAD180 for reducing the first ISI component included in the fourth data DIN270 may be the third sensing signal SAD180 corresponding to the third data DIN180.

The sampling feedback signal may be the sampling data corresponding to a second previous data that is received prior to the currently received data by two data periods. For example, the first sampling feedback signal SPD180, which is input to the first IDFE 1110 for reducing the second ISI component included in the first data DIN0, may be the third sampling data SPD180. The third sampling data SPD180 may be generated based upon the third data DIN180 that is received prior to the first data DIN0 by two data periods. Similarly, the second sampling feedback signal SPD270 for reducing the second ISI component included in the second data DIN90 may be the fourth sampling data SPD270 corresponding to the fourth data DIN270. The third sampling feedback signal SPD0 for reducing the second ISI component included in the third data DIN180 may be the first sampling data SPD0 corresponding to the first data DIN0. The fourth sampling feedback signal SPD90 for reducing the second ISI component included in the fourth data DIN270 may be the second sampling data SPD90 corresponding to the second data DIN90.

In an exemplary embodiment, each of the first through fourth IDFEs 1110, 1120, 1130, 1140 may further receive the second sampling feedback signal corresponding to a third previous data that is received prior to the currently received data by three data periods. For example, the first IDFE 1110 may further receive the fourth sampling feedback signal SPD90 that is substantially the same as the second sampling data SPD90. The second sampling data SPD90 may be generated based upon the second data DIN90 that is received prior to the first data DIN0 by three data periods. In this case, the first IDFE 1110 may reduce the second ISI component included in the first data DIN0 in response to the first sampling feedback signal SPD 180 and may further reduce the third ISI component included in the first data DIN0 in response to the fourth sampling feedback signal SPD90.

The data receiver 1000*a* may deserialize the data signal DIN that includes the first through fourth data DIN0, DIN90, DIN180, DIN270 sequentially input to the integration unit 1100*a* and may output the deserialized sampling data SPD0, SPD90, SPD180, SPD270, each having reduced ISI.

Figure 3:
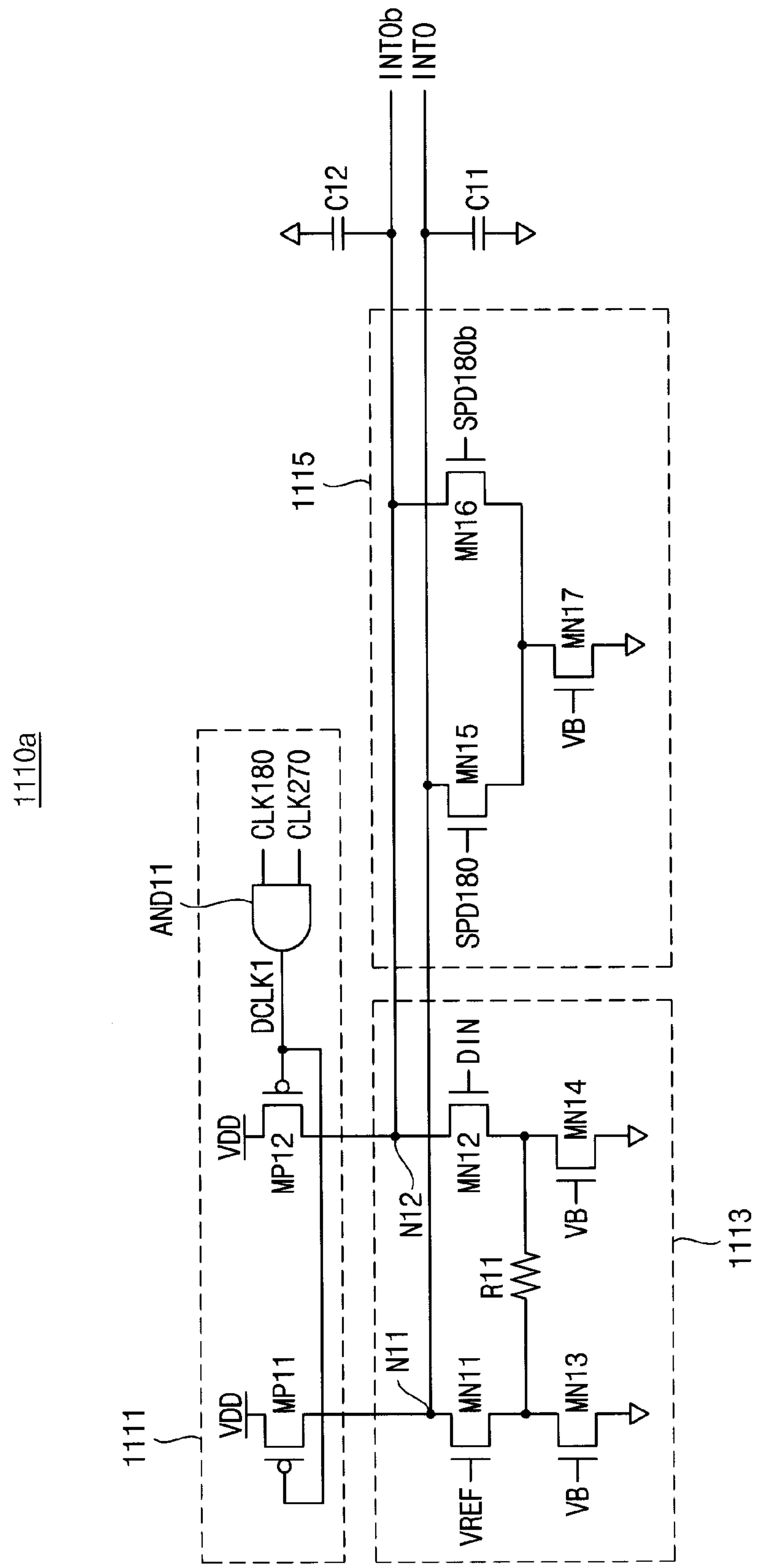
FIG. 3 is a circuit diagram illustrating an example of a first integrating decision feedback equalizer (IDFE) included in the data receiver of FIG. 2.

Although the data receiver 1000*a* including four IDFEs, four SADFEs and four latch circuits is illustrated in FIG. 3 for convenience of illustration, the number of the IDFEs, the SADFEs and the latch circuits are not limited thereto.

FIG. 3 is a circuit diagram illustrating an example of the first IDFE included in the data receiver of FIG. 2.

Referring to FIG. 3, the first IDFE 1110*a* may include a precharge unit 1111, an integration signal generation unit 1113 and a feedback unit 1115. The first IDFE 1110*a* may further include a first capacitor C11 and a second capacitor C12.

The precharge unit 1111 may precharge a first node N11 and a second node N12 to a power supply voltage VDD in response to the third and fourth clock signals CLK180, CLK270. The first and second nodes N11, N12 may be output terminals of the first IDFE 1110*a* for connection to 1$^{st}$ SADFE 1210. The first node N11 may output the first integration signal INT0 and the second node N12 may output an inversion signal INT0*b* of the first integration signal INT0.

The precharge unit 1111 may include a first p-type metal oxide semiconductor (PMOS) transistor MP11, a second PMOS transistor MP12 and an AND gate AND11. The AND gate AND11 may generate a first driving clock signal DCLK1 by performing an AND operation on the third and fourth clock signals CLK180, CLK270. The first PMOS transistor MP11 may be connected between the power supply voltage VDD and the first node N11 and may have a gate electrode receiving the first driving clock signal DCLK1. The second PMOS transistor MP12 may be connected between the power supply voltage VDD and the second node N12 and may have a gate electrode receiving the first driving clock signal DCLK1.

The integration signal generation unit 1113 may integrate the first data DIN0 included in the data signal DIN to generate the first integration signal INT0 and the inverted first integration signal INT0*b* in response to the reference voltage VREF and may provide the first integration signal INT0 to the first node N11 and the inverted first integration signal INT0*b* to the second node N12.

The integration signal generation unit 1113 may include a first n-type metal oxide semiconductor (NMOS) transistor MN11, a second NMOS transistor MN12, a third NMOS transistor MN13, a fourth NMOS transistor MN14 and a resistor R11. The first NMOS transistor MN11 may have a first electrode (e.g., a drain) connected to the first node N11, a gate electrode receiving the reference voltage VREF, and a second electrode (e.g., a source). The second NMOS transistor MN12 may have a first electrode (e.g., a drain) connected to the second node N12, a gate electrode receiving the data signal DIN, and a second electrode (e.g., a source). The resistor R11 may be connected between the second electrode of the first NMOS transistor MN11 and the second electrode of the second NMOS transistor MN12. The third NMOS transistor MN13 may be connected between the second electrode of the first NMOS transistor MN11 and a ground voltage and may have a gate electrode receiving a bias voltage VB. The fourth NMOS transistor MN14 may be connected between the second electrode of the second NMOS transistor MN12 and the ground voltage and may have a gate electrode receiving the bias voltage VB.

The feedback unit 1115 may be connected to the first and second nodes N11, N12 and may reduce the ISI components (e.g., the second ISI component) included in the first data DIN0 based upon the first sampling feedback signal SPD180. For example, the feedback unit 1115 may compensate for distortion in the first data DIN0 due to the second ISI component.

The feedback unit 1115 may include a fifth NMOS transistor MN15, a sixth NMOS transistor MN16 and a seventh NMOS transistor MN17. The fifth NMOS transistor MN15 may have a first electrode (e.g., a drain) connected to the first node N11, a gate electrode receiving the first sampling feedback signal SPD180 and a second electrode (e.g., a source). The sixth NMOS transistor MN16 may have a first electrode (e.g., a drain) connected to the second node N12, a gate electrode receiving an inversion signal SPD180*b* of the first sampling feedback signal SPD180, and a second electrode (e.g., a source) connected to the second electrode of the fifth NMOS transistor MN15. The seventh NMOS transistor MN17 may be connected between the second electrode of the fifth NMOS transistor MN15 and the ground voltage and may have a gate electrode receiving the bias voltage VB.

The first capacitor C11 may be connected between the first node N11 and the ground voltage and may store the first integration signal INT0. The second capacitor C12 may be connected between the second node N12 and the ground voltage and may store the inverted first integration signal INT0*b*.

In operation, when the data signal DIN input to the first IDFE 1110*a* does not correspond to the first data DIN0, the first and second nodes N11, N12 may be precharged to the power supply voltage VDD and the first integration signal INT0 and the inverted first integration signal INT0*b* may have a precharge voltage level (i.e., a power supply voltage level), respectively. When the data signal DIN input to the first IDFE 1110*a* corresponds to the first data DIN0, the first IDFE 1110*a* may stop performing such precharge operation and may perform an integrating operation and a feedback operation in response to the reference voltage VREF, the first data DIN0 and the first sampling feedback signal SPD180. Thus, the first integration signal INT0 may have a voltage level corresponding to the first data DIN0 and the distortion in the first data DIN0 due to the second ISI component may be compensated.

Although the first IDFE 1110*a* is illustrated in FIG. 3 for convenience of illustration, the second, third and fourth IDFEs 1120, 1130, 1140 included in the data receiver 1000*a* of FIG. 2 may have substantially the same structure as the first IDFE 1110*a* of FIG. 3, respectively. For example, if the third clock signal CLK180, the fourth clock signal CLK270, the first sampling feedback signal SPD180 and the first integration signal INT0 in FIG. 3 are replaced with the fourth clock signal CLK270, the first clock signal CLK0, the second sampling feedback signal SPD270 and the second integration signal INT90, respectively, the first IDFE 1110*a* of FIG. 3 may be the second IDFE 1120 in FIG. 2. Similarly, if the third clock signal CLK180, the fourth clock signal CLK270, the first sampling feedback signal SPD180 and the first integration signal INT0 in FIG. 3 are replaced with the first clock signal CLK0, the second clock signal CLK90, the third sampling feedback signal SPD0 and the third integration signal INT180, respectively, the first IDFE 1110*a* of FIG. 3 may be the third IDFE 1130 in FIG. 2. If the third clock signal CLK180, the fourth clock signal CLK270, the first sampling feedback signal SPD180 and the first integration signal INT0 in FIG. 3 are replaced with the second clock signal CLK90, the third clock signal CLK180, the fourth sampling feedback signal SPD90 and the fourth integration signal INT270, respectively, the first IDFE 1110*a* of FIG. 3 may be the fourth IDFE 1140 in FIG. 2.

Figure 4:
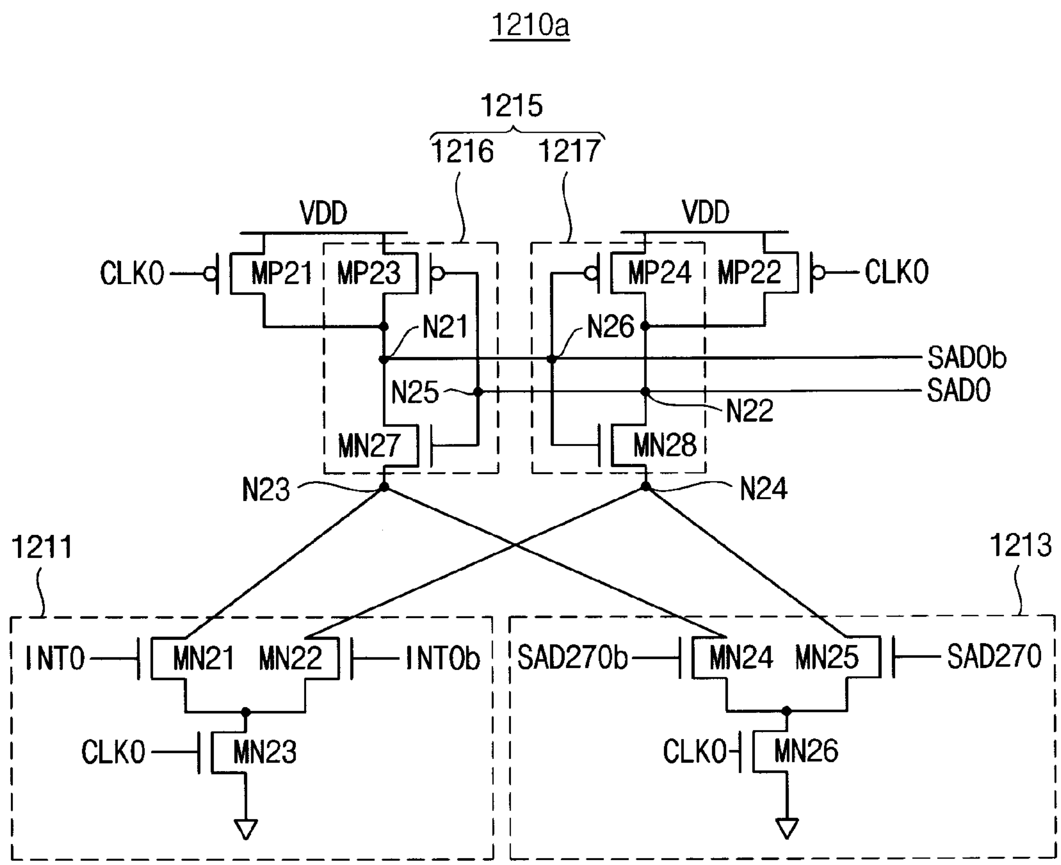
FIG. 4 is a circuit diagram illustrating an example of a first sense-amplifier-based decision feedback equalizer (SADFE) included in the data receiver of FIG. 2.

FIG. 4 is a circuit diagram illustrating an exemplary embodiment of the first SADFE included in the data receiver of FIG. 2.

Referring to FIG. 4, the first SADFE 1210*a* may include a precharge unit MP21, MP22, an integration signal comparison unit 1211, a feedback signal comparison unit 1213 and a sensing signal generation unit 1215.

The precharge unit MP21, MP22 may precharge a first node N21 and a second node N22 to the power supply voltage VDD in response to the first clock signal CLK0. The first and second nodes N21, N22 may be output terminals of the first SADFE 1210*a* for connection to 1st latch 1310 and to 2nd SADFE 1220. The first node N21 may output an inversion signal SAD0*b* of the first sensing signal SAD0 and the second node N22 may output the first sensing signal SAD0.

The precharge unit MP21, MP22 may include a first PMOS transistor MP21 and a second PMOS transistor MP22. The first PMOS transistor MP21 may be connected between the power supply voltage VDD and the first node N21 and may have a gate electrode receiving the first clock signal CLK0. The second PMOS transistor MP22 may be connected between the power supply voltage VDD and the second node N22 and may have a gate electrode receiving the first clock signal CLK0.

The integration signal comparison unit 1211 may compare the first integration signal INT0 with the inverted first integration signal INT0*b* and may amplify a voltage difference between a voltage level of the first integration signal INT0 and a voltage level of the inverted first integration signal INT0*b*.

The integration signal comparison unit 1211 may include a first NMOS transistor MN21, a second NMOS transistor MN22 and a third NMOS transistor MN23. The first NMOS transistor MN21 may have a first electrode (e.g., drain) connected to a third node N23, a gate electrode receiving the first integration signal INT0, and a second electrode (e.g., source). The second NMOS transistor MN22 may have a first electrode (e.g., drain) connected to a fourth node N24, a gate electrode receiving the inverted first integration signal INT0*b*, and a second electrode (e.g., source) connected to the second electrode of the first NMOS transistor MN21. The third NMOS transistor MN23 may be connected between the second electrode of the first NMOS transistor MN21 and the ground voltage and may have a gate electrode receiving the first clock signal CLK0.

The feedback signal comparison unit 1213 may compare the first sensing feedback signal SAD270 with an inversion signal SAD270*b* of first sensing feedback signal SAD270 and may amplify a voltage difference between a voltage level of the first sensing feedback signal SAD270 and a voltage level of the inverted first sensing feedback signal SAD270*b*.

The feedback signal comparison unit 1213 may include a fourth NMOS transistor MN24, a fifth NMOS transistor MN25 and a sixth NMOS transistor MN26. The fourth NMOS transistor MN24 may have a first electrode (e.g., drain) connected to the third node N23, a gate electrode receiving the inverted first sensing feedback signal SAD270*b*, and a second electrode (e.g., source). The fifth NMOS transistor MN25 may have a first electrode (e.g., drain) connected to the fourth node N24, a gate electrode receiving the first sensing feedback signal SAD270, and a second electrode (e.g., source) connected to the second electrode of the fourth NMOS transistor MN24. The sixth NMOS transistor MN26 may be connected between the second electrode of the fourth NMOS transistor MN24 and the ground voltage and may have a gate electrode receiving the first clock signal CLK0.

The sensing signal generation unit 1215 may be connected to the first node N21 and the second node N22. The sensing signal generation unit 1215 may reduce the ISI components (e.g., the first ISI component) included in the first data DIN0 and may generate the first sensing signal SAD0 and an inversion signal SAD0*b* of the first sensing signal SAD0 based upon comparison operations of the integration signal comparison unit 1211 and the feedback signal comparison unit 1213. For example, the sensing signal generation unit 1215 may compensate for distortion in the first data DIN0 due to the first ISI component.

The sensing signal generation unit 1215 may include a first inverter 1216 and a second inverter 1217. The first inverter 1216 may be connected between the power supply voltage VDD and the third node N23. The second inverter 1217 may be connected between the power supply voltage VDD and the fourth node N24. An output terminal (i.e., the second node N22) of the second inverter 1217 may be connected to an input terminal (i.e., a fifth node N25) of the first inverter 1216 and may output the first sensing signal SAD0. An output terminal (i.e., the first node N21) of the first inverter 1216 may be connected to an input terminal (i.e., a sixth node N26) of the second inverter 1217 and may output the inverted first sensing signal SAD0*b*.

The first inverter 1216 may include a third PMOS transistor MP23 and a seventh NMOS transistor MN27 that are serially connected between the power supply voltage VDD and the third node N23. A gate electrode of the third PMOS transistor MP23 and a gate electrode of the seventh NMOS transistor MN27 may be connected to each other. The second inverter 1217 may include a fourth PMOS transistor MP24 and a eighth NMOS transistor MN28 that are serially connected between the power supply voltage VDD and the fourth node N24. A gate electrode of the fourth PMOS transistor MP24 and a gate electrode of the eighth NMOS transistor MN28 may be connected to each other.

In operation, when the first clock signal CLK0 is disabled, the first and second nodes N21, N22 may be precharged to the power supply voltage VDD and the first sensing signal SAD0 and the inverted first sensing signal SAD0*b* may have the power supply voltage level, respectively. When the first clock signal CLK0 is enabled, the first SADFE 1210*a* may stop performing such precharge operation and may performing a sensing operation and a feedback operation in response to the first integration signal INT0 and the first sensing feedback signal SAD270. Thus, the first sensing signal SAD0 may have a voltage level corresponding to the first data DIN0 and the distortion in the first data DIN0 due to the first ISI component may be compensated.

Typically, an amount of the distortion in the first data DIN0 due to the first ISI component may be larger than an amount of the distortion in the first data DIN0 due to the second ISI component. Thus, a first compensation level corresponding to the first ISI component may be different from a second compensation level corresponding to the second ISI component. For example, the first compensation level may be larger than the second compensation level. The first compensation level may be determined by a first feedback current that flows through the sixth NMOS transistor MN26 included in the feedback signal comparison unit 1213 in FIG. 4 and is used to compensate for the distortion in the first data DIN0 due to the first ISI component. The second compensation level may be determined by a second feedback current that flows through the seventh NMOS transistor MN17 included in the feedback unit 1115 in FIG. 3 and is used to compensate for the distortion in the first data DIN0 due to the second ISI component. A level of the first feedback current may be determined by a type, a size or a threshold voltage of the sixth NMOS transistor MN26 in FIG. 4 and a level of the second feedback current may be determined by a type, a size or a threshold voltage of the seventh NMOS transistor MN17 in FIG. 3.

Although the first SADFE 1210*a* is illustrated in FIG. 4 as an exemplary embodiment, the second, third and fourth SADFEs 1220, 1230, 1240 included in the data receiver 1000*a* of FIG. 2 may have substantially the same structure as the first SADFE 1210*a* of FIG. 4, respectively. For example, if the first clock signal CLK0, the first integration signal INT0, the first sensing feedback signal SAD270 and the first sensing signal SAD0 in FIG. 4 are replaced with the second clock signal CLK90, the second integration signal INT90, the second sensing feedback signal SAD0 and the second sensing signal SAD90, respectively, the first SADFE 1210*a* of FIG. 4 may be the second SADFE 1220 in FIG. 2. Similarly, if the first clock signal CLK0, the first integration signal INT0, the first sensing feedback signal SAD270 and the first sensing signal SAD0 in FIG. 4 are replaced with the third clock signal CLK180, the third integration signal INT180, the third sensing feedback signal SAD90 and the third sensing signal SAD180, respectively, the first SADFE 1210*a* of FIG. 4 may be the third SADFE 1230 in FIG. 2. If the first clock signal CLK0, the first integration signal INT0, the first sensing feedback signal SAD270 and the first sensing signal SAD0 in FIG. 4 are replaced with the fourth clock signal CLK270, the fourth integration signal INT270, the fourth sensing feedback signal SAD180 and the fourth sensing signal SAD270, respectively, the first SADFE 1210*a* of FIG. 4 may be the fourth SADFE 1240 in FIG. 2.

Figure 5:
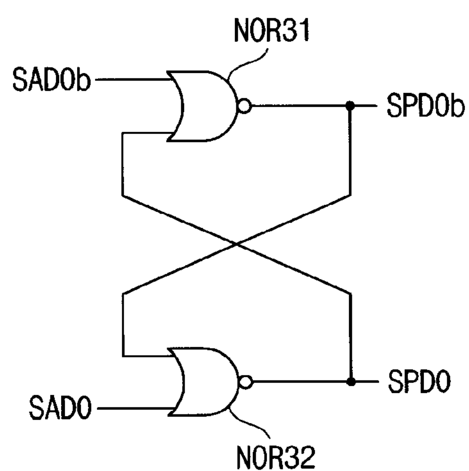
FIG. 5 is a circuit diagram illustrating an example of a first latch circuit included in the data receiver of FIG. 2.

FIG. 5 is a circuit diagram illustrating an exemplary embodiment of the first latch circuit included in the data receiver of FIG. 2.

Referring to FIG. 5, the first latch 1310*a* may include a first NOR gate NOR31 and a second NOR gate NOR32. The first latch 1310*a* may latch the first sensing signal SAD0 to generate the first sampling data SPD0 by using the first and second NOR gates NOR31, NOR32.

The first NOR gate NOR31 may generate an inversion signal SPD0*b* of the first sampling data SPD0 by performing a NOR operation on the inverted first sensing signal SAD0*b* and the first sampling data SPD0 that is output from the second NOR gate NOR32. The second NOR gate NOR32 may generate the first sampling data SPD0 by performing the NOR operation on the first sensing signal SAD0 and the inverted first sampling data SPD0*b* that is output from the first NOR gate NOR31.

Although the first latch circuit 1310*a* is illustrated in FIG. 5 for convenience of illustration, the second, third and fourth latch circuits 1320, 1330, 1340 included in the data receiver 1000*a* of FIG. 2 may have substantially the same structure as the first latch circuit 1310*a* of FIG. 5, respectively.

The first IDFE 1110*a* of FIG. 3, the first SADFE 1210*a* of FIG. 4 and the first latch circuit 1310*a* of FIG. 5 may be implemented by various structures. For example, the precharge unit 1111 included in the first IDFE 1110*a* of FIG. 3 and the precharge unit MP21, MP22 included in the first SADFE 1210*a* of FIG. 4 may further include a plurality of resistors. The transistors included in the first IDFE 1110*a* of FIG. 3 and the first SADFE 1210*a* of FIG. 4 may be replaced with other transistors having different types. The NOR gates included in the latch circuit 1310*a* of FIG. 5 may be replaced with inverters and/or NAND gates.

Figure 6:
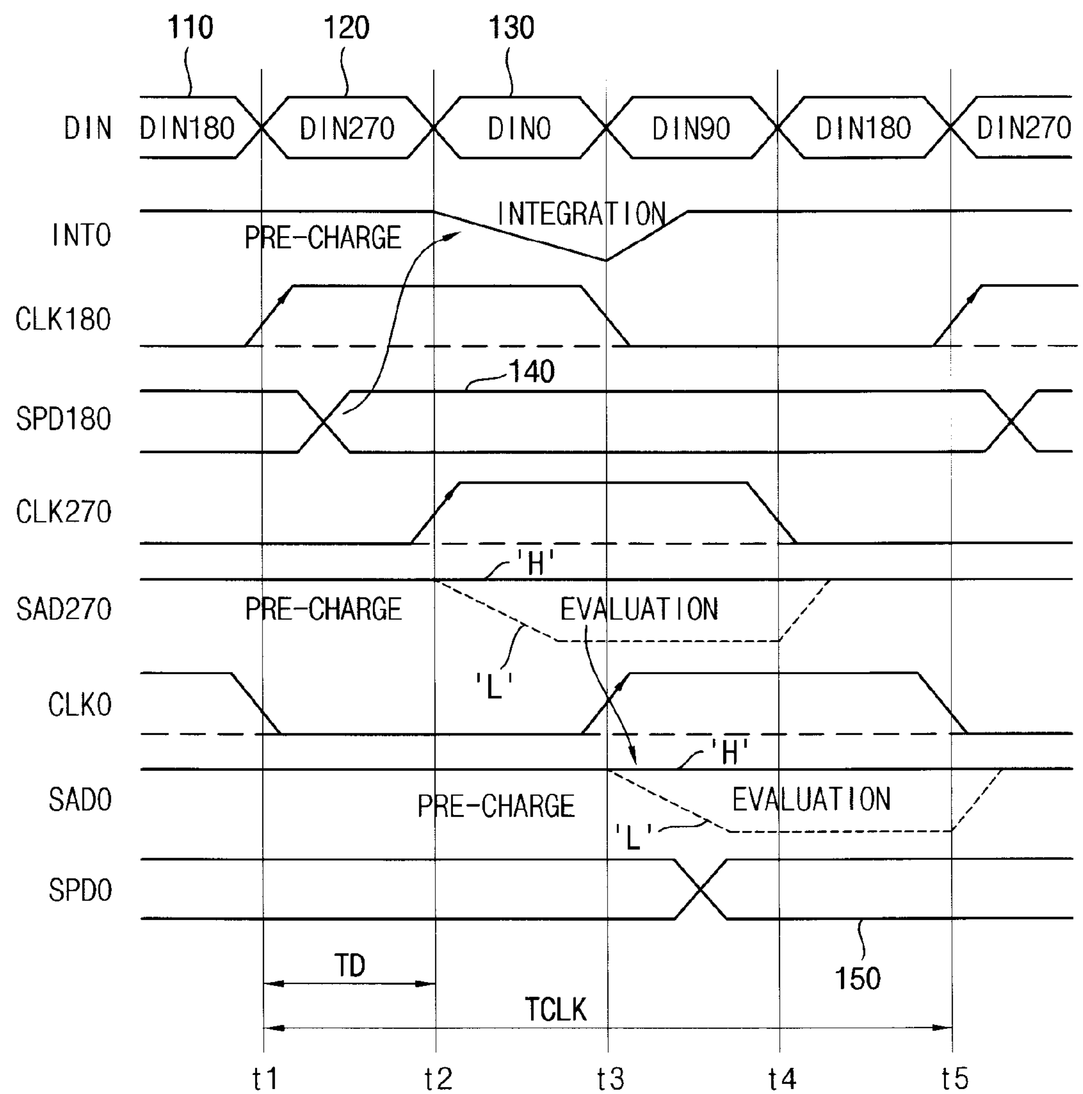
FIG. 6 is a timing diagram illustrating an exemplary operation of the data receiver of FIG. 2.

FIG. 6 is a timing diagram illustrating an operation of the data receiver of FIG. 2.

Referring to FIG. 6, the data signal DIN includes the first data DIN0, the second data DIN90, the third data DIN180 and the fourth data DIN270. Each of the data DIN0, DIN90, DIN180, DIN270 has the same data period TD. Each of the clock signals CLK0, CLK90, CLK180, CLK270 has the clock period TCLK.

The data DIN0, DIN90, DIN180, DIN270 are sequentially input to the data receiver 1000*a* during one clock period TCLK. Each data set including the first through fourth data DIN0, DIN90, DIN180, DIN270 may be input to the data receiver 1000*a* for each clock period TCLK. The clock signals CLK0, CLK90, CLK180, CLK270 have a phase difference corresponding to a value calculated by dividing the clock period TCLK with four (i.e., the data period TD). The third clock signal CLK180 has a phase difference of 2*TD with respect to the first clock signal CLK0. The fourth clock signal CLK270 may have a phase difference of TD with respect to the third clock signal CLK180.

Hereinafter, the operation of the data receiver 1000*a* of FIG. 2 for generating the first sampling data SPD0 150 based upon the first data DIN0 130 included in the data signal DIN is described with reference to FIGS. 2 through 6.

At time t1, the third clock signal CLK180 transitions from a logic low level to a logic high level. During a first time period from time t1 to time t2, the third clock signal CLK180 has the logic high level (i.e., enabled), the fourth clock signal CLK270 has the logic low level (i.e., disabled), and thus the first driving clock signal DCLK1 has the logic low level (i.e., disabled). The first and second PMOS transistors MP11, MP12 included in the first IDFE 1110*a* of FIG. 3 are turned on. The first IDFE 1110*a* of FIG. 3 precharges the first and second nodes N11, N12 to the power supply voltage VDD. The first integration signal INT0 has a precharge voltage level (i.e., the power supply voltage level).

The first clock signal CLK0 has the logic low level (i.e., disabled) during the first time period. The first and second PMOS transistors MP21, MP22 included in the first SADFE 1210*a* of FIG. 4 are turned on and the third and sixth NMOS transistors MN23, MN26 included in the first SADFE 1210*a* of FIG. 4 are turned off. The first SADFE 1210*a* of FIG. 4 precharges the first and second nodes N21, N22 to the power supply voltage VDD. The first sensing signal SAD0 has the precharge voltage level.

At time t2, the fourth clock signal CLK270 transitions from the logic low level to the logic high level. During a second time period from time t2 to time t3, the third clock signal CLK180 maintains the logic high level, the fourth clock signal CLK270 has the logic high level (i.e., enabled), and thus the first driving clock signal DCLK1 has the logic high level (i.e., enabled). The first and second PMOS transistors MP11, MP12 included in the first IDFE 1110*a* of FIG. 3 are turned off. The first IDFE of FIG. 3 reduces the second ISI component included in the first data DIN0 in response to the first sampling feedback signal SPD180 140 and integrates the first data DIN0 130 in response to the reference voltage VREF to provide the first integration signal INT0. The second ISI component is caused by the third data DIN180 110 that is received prior to the first data DIN0 130 by two data periods. The feedback unit 1115 in FIG. 3 compensates for the distortion in the first data DIN0 130 due to the second ISI component based upon the first sampling feedback signal SPD180 140 that is generated by equalizing and sampling the third data DIN180 110. When such integration operation is completed, the first integration signal INT0 has a first voltage level corresponding to the first data DIN0 130 at time t3.

The first clock signal CLK0 maintains the logic low level during the second time period. The first and second PMOS transistors MP21, MP22 included in the first SADFE 1210*a* of FIG. 4 are still turned on and the third and sixth NMOS transistors MN23, MN26 included in the first SADFE 1210*a* of FIG. 4 are still turned off. The first SADFE 1210*a* of FIG. 4 still performs the precharge operation and the first sensing signal SAD0 maintains the precharge voltage level.

At time t3, the third clock signal CLK180 transitions from the logic high level to the logic low level. During a third time period from time t3 to time t4, the third clock signal CLK180 has the logic low level (i.e., disabled), the fourth clock signal CLK270 maintains the logic low level, and thus the first driving clock signal DCLK1 has the logic low level (i.e., disabled). The first and second PMOS transistors MP11, MP12 included in the first IDFE 1110*a* of FIG. 3 are turned on. The first IDFE 1110*a* of FIG. 3 precharges the first and second nodes N11, N12 to the power supply voltage VDD. A voltage level of the first integration signal INT0 changes from the first voltage level to the precharge voltage level.

At time t3, the first clock signal CLK0 transitions from the logic low level to the logic high level. During the third time period, the first and second PMOS transistors MP21, MP22 included in the first SADFE 1210*a* of FIG. 4 are turned off and the third and sixth NMOS transistors MN23, MN26 included in the first SADFE 1210*a* of FIG. 4 are turned on. The first SADFE 1210*a* of FIG. 4 reduces the first ISI component included in the first data DIN0 in response to the first sensing feedback signal SAD270 and senses the first integration signal INT0 to provide the first sensing signal SAD0. The first ISI component is caused by the fourth data DIN270 120 that is received prior to the first data DIN0 130 by one data period. The feedback signal comparison unit 1213 and the sensing signal generation unit 1215 in FIG. 4 compensates for the distortion in the first data DIN0 130 due to the first ISI component in response to first sensing feedback signal SAD270 that is generated by equalizing and sampling the fourth data DIN270 120. The first sensing signal SAD0 has a second voltage level ('H' or 'L') corresponding to the first data DIN0 130. The first latch circuit 1310*a* of FIG. 5 latches the first sensing signal SAD0 to generate the first sampling data SPD0 150 corresponding to the first data DIN0 130.

At time t4, the fourth clock signal CLK270 transitions from the logic high level to the logic low level. At time t5, the first clock signal CLK0 transitions from the logic high level to the logic low level. Thus, the first and second PMOS transistors MP21, MP22 included in the first SADFE 1210*a* of FIG. 4 are turned on and the third and sixth NMOS transistors MN23, MN26 included in the first SADFE 1210*a* of FIG. 4 are turned off.

As illustrated in FIG. 6, the first SADFE 1210*a* of FIG. 4 may generate the first sensing signal SAD0 within a single data period TD (i.e., the third time period). However, the first IDFE 1110*a* of FIG. 3 may integrate the first data DIN0 130 during the single data period TD (i.e., the second time period) and thus the total period of time required to generate the first integration signal INT0 may be longer than the single data period TD. In addition, a SADFE has relatively more complex structure than an IDFE that employs the multi-tap structure. In the data receiver 1000*a* according to an exemplary embodiment, the integration unit 1100*a* may include a plurality of IDFEs for reducing the first ISI component and the sense amplification unit 1200*a* may include a plurality of SADFEs for reducing the second ISI component. Thus, the data receiver 1000*a* may have relatively small size and relatively low power consumption and may effectively receive the data signal to generate the sampling data signal. For example, in comparison with a conventional data receiver including only IDFEs, power consumption of the data receiver 1000*a* is reduced by 37% with respect to power consumption of the conventional data receiver and a size of the data receiver 1000*a* is reduced by 24% with respect to a size of the conventional data receiver. "Size" as used herein means a linear measure, such as an area.

Although the operation of the data receiver 1000*a* of FIG. 2 for generating the first sampling data SPD0 150 is illustrated in FIG. 6 for convenience of illustration, operations of the data receiver 1000*a* of FIG. 2 for generating the second, third and fourth data SPD90, SPD180, SPD270 may be substantially the same as the operation of the data receiver 1000*a* of FIG. 2 for generating the first sampling data SPD0, respectively.

Figure 7:
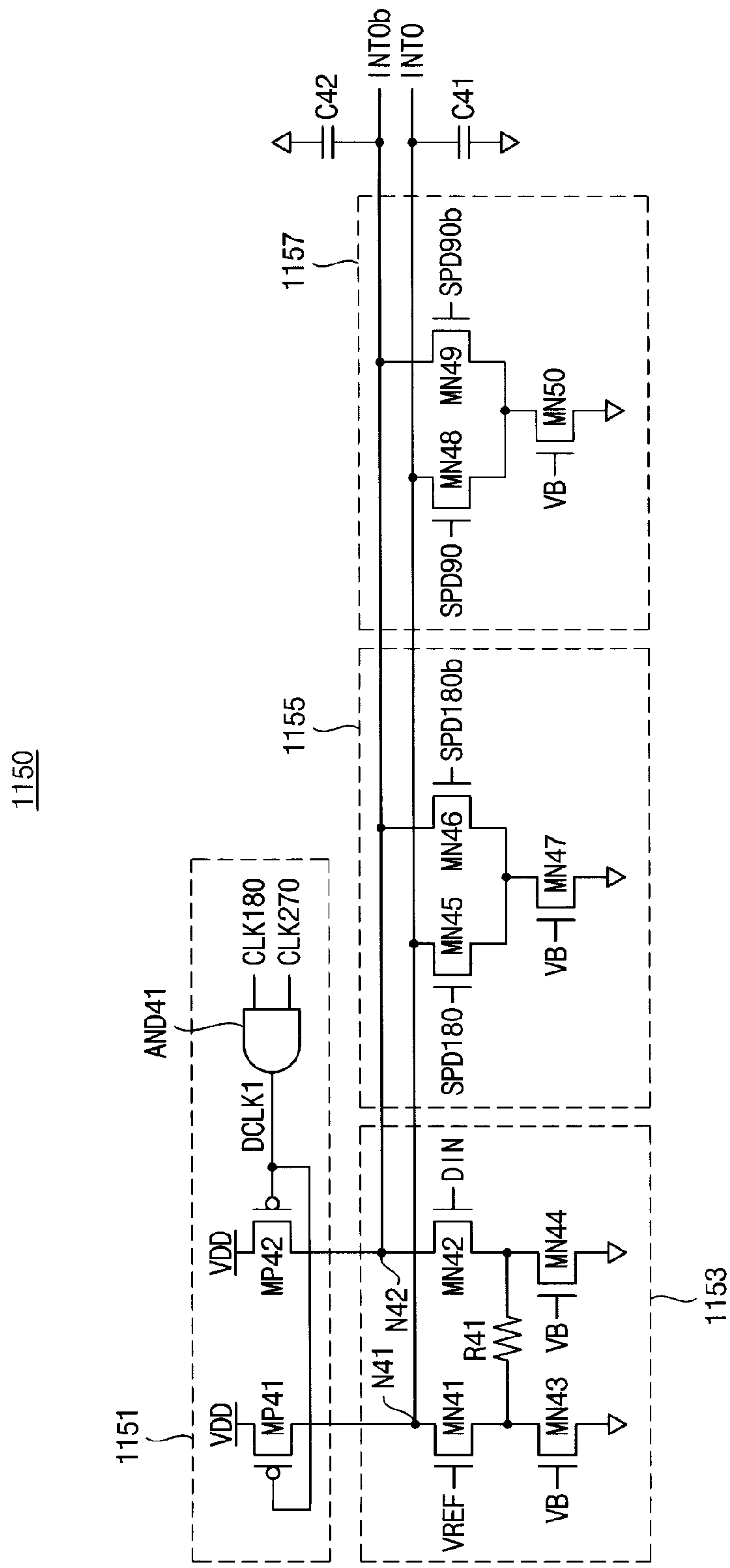
FIG. 7 is a circuit diagram illustrating another example of the first IDFE included in the data receiver of FIG. 2.

FIG. 7 is a circuit diagram illustrating an exemplary embodiment of the first IDFE included in the data receiver of FIG. 2.

As described with reference to FIG. 2, each of the first through fourth IDFEs 1110, 1120, 1130, 1140 may further receive the second sampling feedback signal corresponding to the third previous data that is received prior to the currently received data by three data periods. The each of the first through fourth IDFEs 1110, 1120, 1130, 1140 may further reduce the third ISI component included in the data signal DIN in response to the second sampling feedback signal.

Referring to FIG. 7, the first IDFE 1150 may include a precharge unit 1151, an integration signal generation unit 1153, a first feedback unit 1155 and a second feedback unit 1157. The first IDFE 1150 may further include a first capacitor C41 and a second capacitor C42.

As compared with the first IDFE 1110*a* of FIG. 3, the first IDFE 1150 further includes the second feedback unit 1157. The precharge unit 1151, the integration signal generation unit 1153, the first feedback unit 1155 and the capacitors C41, C42 may have substantially the same structure as the precharge unit 1111, the integration signal generation unit 1113, the feedback unit 1115 and the capacitors C11, C12 in FIG. 3, respectively. The precharge unit 1151 may precharge a first node N41 connected to $1^{st}$ SADFE 1210 and a second node N42 connected to $1^{st}$ SADFE 1210 to the power supply voltage VDD in response to upon the third and fourth clock signals CLK180, CLK270, and may include a first PMOS transistor MP41, a second PMOS transistor MP42 and an AND gate AND41. The integration signal generation unit 1153 may integrate the first data DIN0 to generate the first integration signal INT0 in response to the reference voltage VREF, may provide the first integration signal INT0 to the first node N41, and may include a first NMOS transistor MN41, a second NMOS transistor MN42, a third NMOS transistor MN43, a fourth NMOS transistor MN44 and a resistor R41. The first feedback unit 1155 may be connected to the first and second nodes N41, N42, may reduce the second ISI component included in the first data DIN0 in response to the first sampling feedback signal SPD180, and may include a fifth NMOS transistor MN45, a sixth NMOS transistor MN46 and a seventh NMOS transistor MN47. The first capacitor C41 may be connected between the first node N41 and the ground voltage, and the second capacitor C42 may be connected between the second node N42 and the ground voltage.

The second feedback unit 1157 may be connected to the first and second nodes N41, N42, and may reduce the third ISI component included in the first data DIN0 in response to the fourth sampling feedback signal SPD90. For example, the second feedback unit 1157 may compensate for distortion in the first data DIN0 due to the third ISI component.

The second feedback unit 1157 may include an eighth NMOS transistor MN48, a ninth NMOS transistor MN49 and a tenth NMOS transistor MN50. The eighth NMOS transistor MN48 may have a first electrode (e.g., a drain) connected to the first node N41, a gate electrode receiving the fourth sampling feedback signal SPD90 and a second electrode (e.g., a source). The ninth NMOS transistor MN49 may have a first electrode (e.g., a drain) connected to the second node N42, a gate electrode receiving an inversion signal SPD90*b* of the fourth sampling feedback signal SPD90, and a second electrode (e.g., a source) connected to the second electrode of the eighth NMOS transistor MN48. The tenth NMOS transistor MN50 may be connected between the second electrode of the eighth NMOS transistor MN48 and the ground voltage and may have a gate electrode receiving the bias voltage VB.

Figure 8:
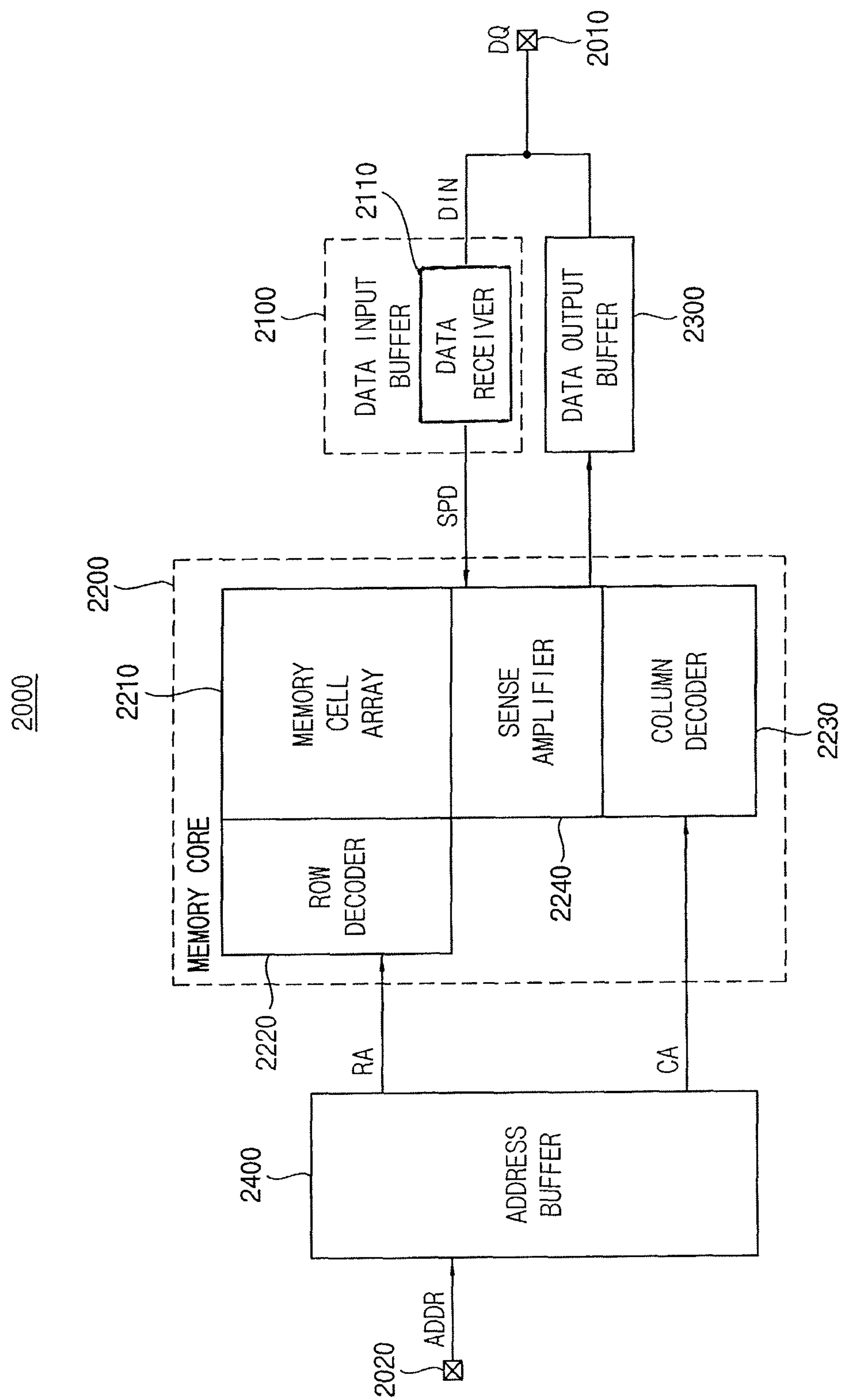
FIG. 8 is a block diagram illustrating a semiconductor memory device according to an exemplary embodiment.

FIG. 8 is a block diagram illustrating a semiconductor memory device according to an exemplary embodiment.

Referring to FIG. 8, the semiconductor memory device 2000 includes a data input buffer 2100, a memory core 2200, a data output buffer 2300 and an address buffer 2400. The semiconductor memory device 2000 may further include a register (not illustrated), a refresh circuit (not illustrated), a prefetch circuit (not illustrated) and a delay locked loop (not illustrated).

The data input buffer 2100 is connected to an external data input/output (I/O) pin 2010. The data input buffer 2100 receives a data signal DIN from the memory controller (not illustrated) through the data I/O pin 2010. The data input buffer 2100 includes a data receiver 2110 that reduces ISI components included in the data signal DIN to generate a sampling data signal SPD.

The data receiver 2110 may be the data receiver 1000 of FIG. 1. The data receiver 2110 include an integration unit for integrating the data signal DIN in response to a sampling feedback signal to generate a first equalization signal, a sense amplification unit for sensing the first equalization signal in response to a sensing feedback signal to generate a second equalization signal, and a latch unit for latching the second equalization signal to generate the sampling data signal SPD. The integration unit may include a plurality of integrating decision feedback equalizers (IDFEs) and the sense amplification unit may include a plurality of sense-amplifier-based decision feedback equalizers (SADFEs). The data receiver 2110 may provide the sampling data signal SPD to the memory core 2200 and/or other internal circuits (not illustrated) included in the semiconductor memory device 2000.

The sensing feedback signal may be the second equalization signal corresponding to a first previous data that is received prior to a currently received data by one data period. The sampling feedback signal may be the sampling data signal SPD corresponding to a second previous data that is received prior to the currently received data by two data periods.

The memory core 2200 stores the sampling data signal SPD provided from the data input buffer 2100 as write data, and provides read data to the data output buffer 2300 based upon the stored write data. The memory core 2200 may include a memory cell array 2210 having a plurality of memory cells that store data, a row decoder 2220 for selecting a word line of the memory cell array 2210 by decoding a row address RA received from the address buffer 2400, a column decoder 2230 for selecting at least one bit line of the memory cell array 2210 by decoding a column address CA received from the address buffer 2400, and a sense amplifier 2240 for generating the read data by sensing the data stored in selected memory cells.

The data output buffer 2300 is connected to the external data I/O pin 2010. The data output buffer 2400 transfers the read data to the memory controller (not illustrated) through the data I/O pin 2010. The address buffer 2400 provides the row address RA and the column address CA to the row decoder 2220 and the column decoder 2230 in response to an address signal ADDR received from a memory controller (not illustrated) through an address pin 2020.

Although one data I/O pin 2010, one address pin 2020, one data input buffer 2100, and one data output buffer 2300 are illustrated in FIG. 8 for convenience of illustration, the semiconductor memory device 2000 may include a plurality of data I/O pins, a plurality of address pins, a plurality of data input buffers, and a plurality of data output buffers.

Figure 9:
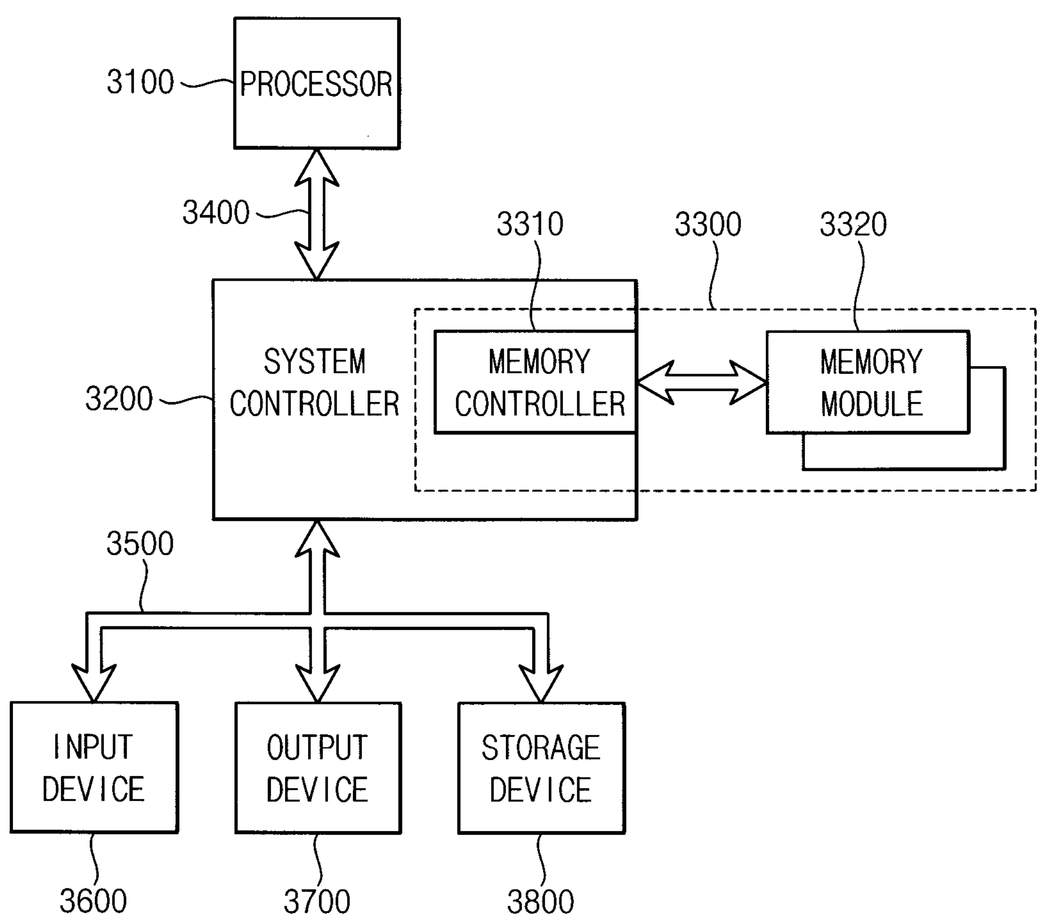
FIG. 9 is a block diagram illustrating a computing system according to an exemplary embodiment.

FIG. 9 is a block diagram illustrating a computing system according to an exemplary embodiment.

Referring to FIG. 9, the computing system 3000 includes a processor 3100, a system controller 3200 and a memory system 3300. The computing system 3000 may further include a processor bus 3400, an extension bus 3500, an input device 3600, an output device 3700, and a storage device 3800. The memory system 3300 may include at least one memory module 3320, and a memory controller 3310 for controlling the memory module 3320. The memory controller 3310 may be included in the system controller 3200.

The processor 3100 may perform various computing functions, such as executing specific software for performing specific calculations or tasks. For example, the processor 3100 may be a microprocessor, a central processing unit (CPU), a digital signal processor, or the like. The processor 3100 may be coupled to the system controller 3200 via the processor bus 3400 including an address bus, a control bus and/or a data bus. The system controller 3200 may be coupled to expansion bus 3500, such as a peripheral-component-interconnect (PCI) bus. The processor 3100 may control the input device 3600, such as a keyboard, a mouse, the output device 3700, such as a printer, a display device, and the storage device 3800, such as a hard disk drive, a compact disk read-only memory (CD-ROM), a solid state drive (SSD).

The memory controller 3310 may control the memory module 3320 to perform a command provided from the processor 3100. The memory module 3320 may store data provided from the memory controller 3310, and may provide the stored data to the memory controller 3310. The memory module 3320 may include a plurality of semiconductor memory devices and each of the plurality of semiconductor memory devices may be the semiconductor memory device 2000 of FIG. 8. For example, each of the plurality of semiconductor memory devices may include at least one of a dynamic random access memory (DRAM), a static random access memory (SRAM), a non-volatile memory, etc.

The computing system 3000 may be applicable to a desktop computer, a notebook, a computer, a work station, a handheld device, or the like.

As described above, the data receiver according to an exemplary embodiment may be adopted in all kinds of communication systems. Particularly, the data receiver according to an exemplary embodiment may be adopted in a semiconductor memory device, a memory module and a memory system.

While the exemplary embodiments and their advantages have been described in detail, it should be understood that various changes, substitutions and alterations may be made herein without departing from the scope of the inventive concept.

What is claimed is:

1. A data receiver in a memory device comprising:

an integration unit configured to integrate a data signal to generate a first equalization signal in response to a sampling feedback signal, the data signal including a plurality of data that are sequentially received;

a sense amplification unit configured to sense the first equalization signal to generate a second equalization signal in response to a sensing feedback signal; and a latch unit configured to latch the second equalization signal to generate a sampling data signal.

2. The data receiver of claim 1, wherein the sensing feedback signal is the second equalization signal corresponding to a first previous data received prior to a currently received data by one data period, and the sampling feedback signal is the sampling data signal corresponding to a second previous data received prior to the currently received data by two data periods.

3. The data receiver of claim 2, wherein the integration unit is configured to receive a second sampling feedback signal and to generate the first equalization signal in response to the second sampling feedback signal, the second sampling feedback signal being the sampling data signal corresponding to a third previous data received prior to the currently received data by three data periods.

4. The data receiver of claim 1, wherein the data signal includes first through N-th data, where N is a natural number equal to or greater than two, and the sampling data signal includes first through N-th sampling data, the first through N-th data having the same data period, and each of the sampling data corresponding to a respective one of the first through N-th data.

5. The data receiver of claim 4, wherein the sampling feedback signal includes first through N-th sampling feedback signals, the first equalization signal includes first through N-th integration signals, and the integration unit includes first through N-th integrating decision feedback equalizers (IDFEs), each of the IDFEs configured to integrate a respective one of the first through N-th data to generate a respective one of the first through N-th integration signals in response to a reference voltage, a clock signal and at least one of the first through N-th sampling feedback signals.

6. The data receiver of claim 5, wherein the first sampling feedback signal is a (N-1)-th sampling data, a second sampling feedback signal is the N-th sampling data, and a k-th sampling feedback signal is a (k-2)-th sampling data, where k is a natural number equal to or greater than three and equal to or less than N.

7. The data receiver of claim 6, wherein the each of the IDFEs includes:

a precharge unit configured to precharge an output terminal to a power supply voltage, the output terminal configured to output the respective one of the first through N-th integration signals;

an integration signal generation unit configured to integrate the respective one of the first through N-th data in response to the reference voltage to generate the respective one of the first through N-th integration signals, and configured to provide the respective one of the first through N-th integration signals to the output terminal; and a feedback unit connected to the output terminal, and configured to reduce intersymbol interference (ISI) components included in the respective one of the first through N-th data in response to a respective one of the first through N-th sampling feedback signals.

8. The data receiver of claim 7, wherein the integration signal generation unit includes:

a first n-type metal oxide semiconductor (NMOS) transistor having a first electrode connected to a first node, a gate electrode configured to receive the reference voltage, and a second electrode, the first node configured to output the respective one of the first through N-th integration signals;

a second NMOS transistor having a first electrode connected to a second node, a gate electrode configured to receive the data signal, and a second electrode, the second node configured to output an inversion signal of the respective one of the first through N-th integration signals;

a resistor connected between the second electrode of the first NMOS transistor and the second electrode of the second NMOS transistor;

a third NMOS transistor, connected between the second electrode of the first NMOS transistor and a ground voltage, which has a gate electrode configured to receive a bias voltage; and a fourth NMOS transistor, connected between the second electrode of the second NMOS transistor and the ground voltage, which has a gate electrode configured to receive the bias voltage.

9. The data receiver of claim 8, wherein the feedback unit includes:

a fifth NMOS transistor having a first electrode connected to the first node, a gate electrode configured to receive the respective one of the first through N-th sampling feedback signals, and a second electrode;

a sixth NMOS transistor having a first electrode connected to the second node, a gate electrode configured to receive an inversion signal of the respective one of the first through N-th sampling feedback signals, and a second electrode connected to the second electrode of the fifth NMOS transistor; and a seventh NMOS transistor, connected between the second electrode of the fifth NMOS transistor and the ground voltage, which has a gate electrode configured to receive the bias voltage.

10. The data receiver of claim 5, wherein the first through N-th data are sequentially input to the integration unit during one period of the clock signal.

11. The data receiver of claim 5, wherein the sensing feedback signal includes first through N-th sensing feedback signals, the clock signal includes first through N-th clock signals, the second equalization signal includes first through N-th sensing signals, and the sense amplification unit includes first through N-th sense-amplifier-based decision feedback equalizers (SADFEs), each of the SADFEs configured to sense the respective one of the first through N-th integration signals to generate a respective one of the first through N-th sensing signals in response to a respective one of the first through N-th clock signals and a respective one of the first through N-th sensing feedback signals.

12. The data receiver of claim 11, wherein the first sensing feedback signal is the N-th sensing signal, and a k-th sensing feedback signal is a (k-1)-th sensing signal, where k is a natural number equal to or greater than two and equal to or less than N.

13. The data receiver of claim 12, wherein the each of the SADFEs includes:

a precharge unit configured to precharge an output terminal to a power supply voltage, the output terminal configured to output the respective one of the first through N-th sensing signals;

an integration signal comparison unit configured to compare the respective one of the first through N-th integration signals with an inversion signal of the respective one of the first through N-th integration signals;

a feedback signal comparison unit configured to compare the respective one of the first through N-th sensing feedback signals with an inversion signal of the respective one of the first through N-th sensing feedback signals; and a sensing signal generation unit connected to the output terminal, configured to reduce ISI components included in the respective one of the first through N-th data and configured to generate the respective one of the first through N-th sensing signals based upon comparison operations of the integration signal comparison unit and the feedback signal comparison unit.

14. The data receiver of claim 13, wherein the sensing signal generation unit includes:

a first inverter connected between the power supply voltage and a first node; and a second inverter connected between the power supply voltage and a second node, wherein an output terminal of the second inverter is connected to an input terminal of the first inverter and is configured to output the respective one of the first through N-th sensing signals, and an output terminal of the first inverter is connected to an input terminal of the second inverter and is configured to output an inversion signal of the respective one of the first through N-th sensing signals.

15. A semiconductor memory device comprising:

a data input buffer having a data receiver configured to reduce intersymbol interference (ISI) components included in a data signal to generate a sampling data signal; and a memory cell array configured to store the sampling data signal and configured to output the stored data, the data receiver including:

an integration unit configured to integrate the data signal in response to a sampling feedback signal to generate a first equalization signal, the data signal including a plurality of data that are sequentially received;

a sense amplification unit configured to sense the first equalization signal in response to a sensing feedback signal to generate a second equalization signal; and a latch unit configured to latch the second equalization signal to generate the sampling data signal.

16. A data receiver in a memory device comprising:

an integration unit configured to sequentially receive consecutive data signals;

a sense amplification unit configured to receive an output of the integration unit; and a latch unit configured to receive the output of the sense amplification unit and to output an equalized sampled data signal, wherein the integration unit integrates a data signal to generate a first equalization signal in response to a sampling feedback signal that corresponds to a previous data signal that is received by the data receiver prior to a currently received data signal by two data periods, wherein the sense amplification unit senses the first equalization signal to generate a second equalization signal in response to another second equalization signal that corresponds to a previous data signal that is received by the data receiver prior to the currently received data signal by one data period, wherein the latch unit latches the second equalization signal to generate the equalized sampled data signal.

17. The data receiver of claim 16, wherein the integration unit receives a second sampling feedback signal comprising a sampling data signal corresponding to a previous data signal that is received prior to the currently received data signal by three data periods.

18. The data receiver of claim 16, wherein the consecutive data signals comprise first through N-th data signals, N being a natural number equal to or greater than two, the first through N-th data signals having a same data period.

19. The data receiver of claim 18, wherein the equalized sampled data signal comprises first through N-th sampling data, each of the sampled data corresponding to a respective one of the first through N-th data signals.

20. The data receiver of claim 16, wherein first through N-th data signals are sequentially input to the integration unit during one period of a clock signal, a clock period being N times larger than a data period, and wherein a first data signal is input to the integration unit during a first data period, a second data signal is input to the integration unit during a second data period, and a N-th data signal is input to the integration unit during a N-th data period.

* * * * *